United States Patent [19]

Bauer et al.

[11] Patent Number: 5,121,083
[45] Date of Patent: Jun. 9, 1992

[54] HIGH FREQUENCY TRANSISTOR POWER AMPLIFIER

[75] Inventors: Helmut Bauer, Weyarn; Uwe Dalisda, Olching, both of Fed. Rep. of Germany

[73] Assignee: Siemens Aktiengesellschaft, Munich, Fed. Rep. of Germany

[21] Appl. No.: 675,515

[22] Filed: Mar. 27, 1991

[30] Foreign Application Priority Data

Mar. 31, 1990 [DE] Fed. Rep. of Germany ....... 4010409

[51] Int. Cl.$^5$ ............................................. H03F 3/68
[52] U.S. Cl. .................................... 330/295; 330/286
[58] Field of Search ............... 330/53, 56, 124 R, 277, 330/286, 295; 333/124, 125, 136, 137

[56] References Cited

U.S. PATENT DOCUMENTS

| | | | |
|---|---|---|---|
| 4,234,854 | 11/1980 | Schellenberg et al. | 330/286 |
| 4,371,845 | 2/1983 | Pitzalis, Jr. | 330/277 |
| 4,812,782 | 3/1989 | Ajioka | 330/286 |
| 4,956,614 | 9/1990 | Baril | 330/286 |

FOREIGN PATENT DOCUMENTS

3202711A1 8/1983 Fed. Rep. of Germany .

OTHER PUBLICATIONS

Patents Abstracts of Japan, E-727, Mar. 15, 1989, vol. 13, No. 109, "Integrated Amplifier Circuit", Kenkichi Hiraide.
Patents Abstracts of Japan, E-783, Jul. 7, 1989, vol. 13, No. 295, "High Frequency Power Amplifier", Hisafumi Okubo.
Motorola TMOS Power MOSFET Data, Chapter 6—"Paralleling Power MOSFETs", p. A-59.
Motorola Engineering Bulletin, Part 1, 1983, "Get 600 Watts RF from Four Power FETs", by Helge Granberg.
Discrete Semiconductors, Nov. 1957, "RF Power MOSFETs" Helge Granberg.
IEEE Journal of Solid-State Circuits, vol. SC-19, No. 4, Aug. 4, 1984, pp. 541-542.

*Primary Examiner*—Steven Mottola
*Attorney, Agent, or Firm*—Hill, Van Santen, Steadman & Simpson

[57] ABSTRACT

In a high frequency transistor power amplifier comprising a plurality of power transistors which are disposed in an annular arrangement, the input terminals of the transistors are connected to a common input through separate input matching circuits and a distributor circuit. The output terminals of the power transistors, on the other hand, are combined directly in a common output connection, without any intermediate matching circuits, this common output connection being connected to a single output matching circuit common to all the power transistors.

9 Claims, 2 Drawing Sheets

HIGH FREQUENCY TRANSISTOR POWER AMPLIFIER

BACKGROUND OF THE INVENTION

1. Field of the Invention

The instant invention relates to a high frequency transistor power amplifier comprising a plurality of power transistors disposed in an annular arrangement such as used, for example, as the final stage in radio or television transmitters.

2. Description of the Prior Art

High frequency transistor power amplifiers of this kind are known (U.S. Pat. No. 4,641,107, German DE-OS 32 07 711, incorporated herein by reference). With these known power amplifiers, not only a separate input matching circuit is associated with each individual power transistor, but also a separate output matching circuit. In other words, resistance transformation and decoupling are effected for each individual transistor both at the input and output ends. Where high power is at stake, such as 1000 watts or more, the structure of the output matching circuits and coupling means for combining the individual transistor contributions is quite complicated technically and rather bulky, apart from being expensive.

SUMMARY OF THE INVENTION

It is an object of the invention to provide a high frequency transistor power amplifier of simple and inexpensive structure, even when destined for the high power range.

According to the invention, a high frequency transistor power amplifier is provided formed of a plurality of power transistors each having an input terminal and an output terminal, and wherein the transistors are formed in an annular arrangement. The input terminals are connected to a common input through separate input matching circuits and a distributor circuit. The output terminals are combined directly in a common output connection without any intermediate matching circuits. The common output connection is connected to a single output matching circuit common to all the power transistors.

The invention no longer provides for the known output matching circuits associated with each individual power transistor. Instead, the output terminals of all the power transistors are combined directly in a common output connection, with the least inductance and transformation. In other words, the electrical connection of the output terminals of the power transistors is realized in such a way that there are no resistance transforming line sections which would add inductance between the individual output terminals and the common output connection. A particularly simple solution in this respect provides for the establishment of a galvanic mutual connection between the individual output terminal tabs disposed in a plane of the power transistors in the ring arrangement by mounting a metal disc axially on top of them. Such a disc is best suited to meet the requirement that the combining of the individual output terminals be without inductance and transformation. This technique of the invention makes it superfluous to provide the expensive, bulky output matching circuits for each power transistor and the coupling means for the decoupled combination of the partial power contributions. Instead, a single common downstream output matching circuit is sufficient to achieve the resistance transformation to the desired output resistance value of the power amplifier. At the input end, separate input matching circuits for each power transistor continue to be used, as is known. They are connected to the common input by way of a suitable power distribution circuit. Proper adaptation of these matching circuits and of the distributor assures good decoupling of the individual power transistors so that oscillations of the amplifier induced by feedback are avoided in spite of the direct combination of the transistor output connections. In view of the fact that the power to be handled at the input end is low, the separate input matching and distribution circuits may be realized rather simply and inexpensively, such as by printed circuit art. Preferably, the power transistors are selected with a view to providing approximately the same amplification and having approximately the same phase response. Where that cannot be achieved by the mere selection of suitable types of transistors, the requirement can be met, for instance, by associating an adjustable correction element at least with some of the transistors at their input ends.

A power amplifier in accordance with this invention in principle may be used for any frequency range. In the short wave range, for instance, the common output matching circuit may be obtained by concentrated lumped circuit technology. In the ultrashort wave region, preferably the coaxial line technique is applied, and for television transmitters, in the frequency range above 400 MHz, the common output matching circuit may be embodied by a cavity resonator or waveguide arrangement.

Apart from the electrical advantages described of a power amplifier according to the invention, the cooling, too, is particularly simple and effective. For instance, if the transistors are fixed to the inside wall of a cooling ring, this cooling ring may be formed at the outside with cooling fins which may be utilized to dissipate the heat due to energy losses. It is likewise possible to mount the transistors on the outside wall of such a cooling ring and have the cooling fins formed at the inside of the ring. It is especially advantageous to provide the common output matching circuit in per se known manner as a coaxial line structure as that will afford an exceptionally simple, stable structure in consideration of the high powers to be dealt with. If the transistors are mounted on the inside wall of a cooling ring the coaxial elements of the output matching circuit are simply arranged inside the cooling ring which, in that case, acts as the outer conductor. If, on the other hand, the transistors are disposed at the outside wall of a cooling ring, this cooling ring could be used as the inner conductor of a coaxial transmission line system which would merely require that an outer conductor ring be provided to encircle the cooling ring. The annular arrangement of the transistors in accordance with the instant invention thus, at the same time, offers very simple and effective cooling and also permits the common output matching circuit to be embodied by a highly uncomplicated structure.

The inventive technique is suitable for use with any kind of power transistor, including field effect transistors and bipolar transistors, and likewise does not depend on whether the particular power amplifier is used as a linear amplifier (e.g. A-mode) or as a CW amplifier (e.g. C-mode).

BRIEF DESCRIPTION OF THE DRAWINGS

The invention will be described further, by way of example, with reference to the accompanying drawings, in which.

DESCRIPTION OF THE PREFERRED EMBODIMENTS

Figure 1:
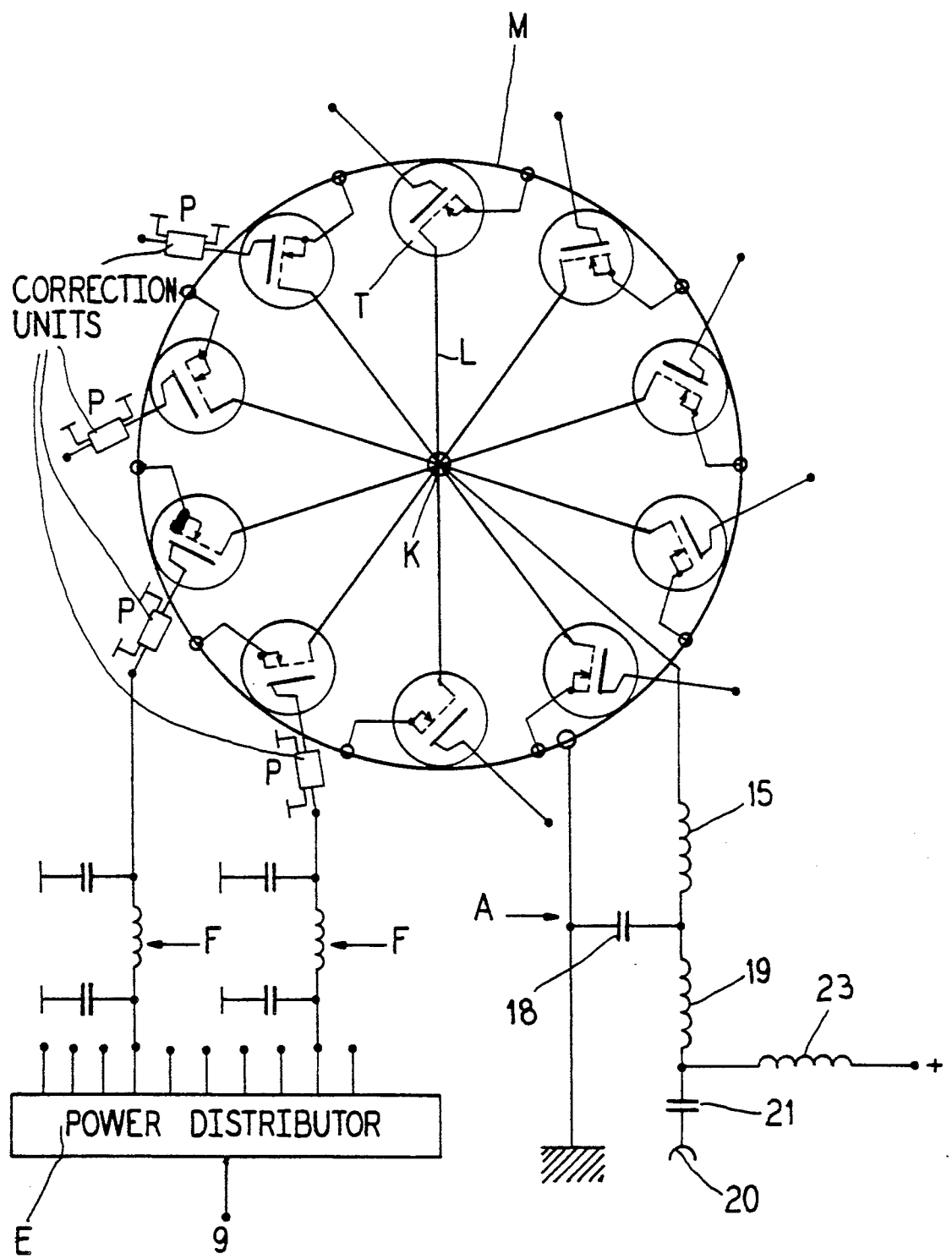
FIG. 1 is a basic circuit diagram of a high frequency power amplifier according to one embodiment of the invention.
Figure 3:
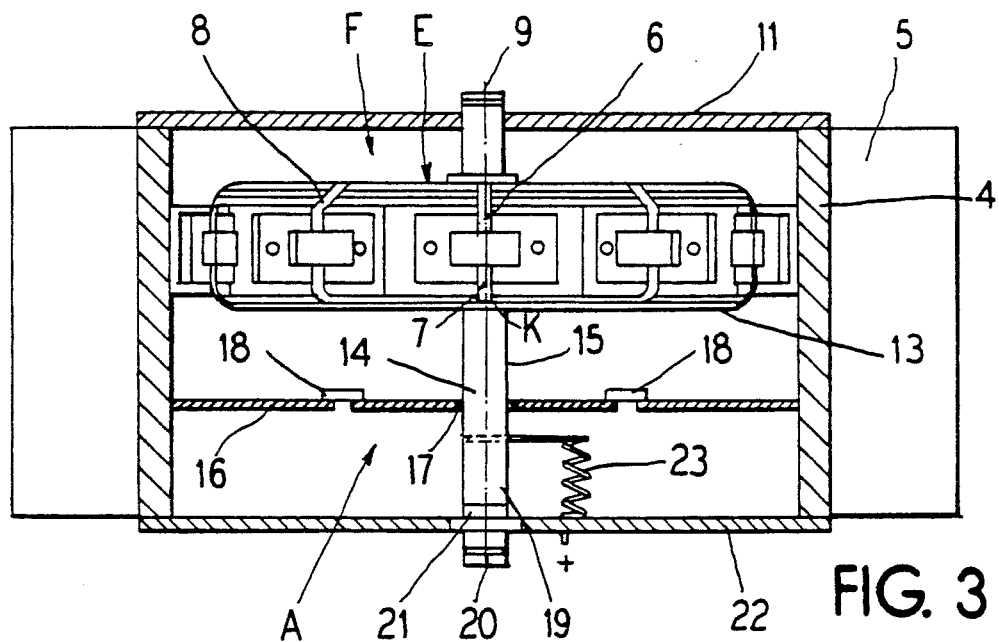
FIG. 3 is a sectional elevation along line I—I in FIG. 2.

The high frequency power amplifier according to the invention shown in FIG. 1, for example an end stage of an ultrahigh frequency transmitter, comprises ten individual field effect power transistors T providing a total output power of 1.5 kW. The individual transistors T are arranged in a ring. In the embodiment illustrated, each field effect transistor T is operated in the source mode, i.e. the output terminals are the drain connections D. These output terminals D of the individual transistors T are combined in a common output connection K, as indicated diagrammatically in FIG. 1 by the connections L. In practice, these connections L are as short as possible. Above all, they do not have any resistance transforming characteristics, nor are they made to have inductance. The use of a metal disc has proved to be particularly advantageous for this purpose as it establishes a galvanic interconnection between the individual drain connections D and the transistors T. This will be described in greater detail with reference to FIG. 3 showing a disc 13. A single output matching circuit A is connected electrically to the output connection K; it serves all ten transistors T in common. The output matching circuit A is dimensioned so as to provide a resistance value of 1 Ω at the output connection K by resistance transformation of the desired output resistance of, for instance, 50 Ω. As each individual transistor T has an output resistance of, for example, 10 Ω and ten transistors are connected in parallel in the embodiment shown, the resulting common output resistance at output connection K thus is 1 Ω. This dimensioning of the matching circuit A consequently offers just the right output resistance of 10 Ω for each individual transistor T. The source connections S of the individual transistors T are connected to a common annular grounding line M.

The input terminals G (gate connections) of the individual transistors all are combined in a common input 9 through separate input matching circuits F and a power distributor E embodied, for example, by a Wilkinson distributor which distributes the power supplied at input 9 among ten outputs 3 to which the input matching circuits F are connected, of which FIG. 1 shows only two for reasons of clarity. The input matching circuits F coordinated with each individual transistor T and the power distributor E make sure that the inputs of the individual transistors T are decoupled so as to exclude oscillations caused by feedback. Furthermore, a correction unit P is associated with each input matching circuit F. It may be designed, for example as a π-network. Preferably, each correction unit P comprises adjustable structural elements which permit the amplification of each individual transistor to be set. They may be provided in the form of adjustable damping members or attenuators. Moreover, adjustable reactance elements preferably are provided to permit the same phase to be adjusted at each output connection D of the transistors T. All the transistors T can be tuned to the same amplification and phase response by means of the corrections units P, or the correction units P can be dimensioned from the very beginning such that all the transistors will provide the same amplification and have the same phase response. The input matching circuits F are dimensioned in per se known manner to provide resistance matching between the input resistance of the transistor T and the output of the power distributor E which acts as a decoupling unit.

In the embodiment shown, ten single transistors are connected in parallel. The number of transistors depends on the desired output power to be furnished by the amplifier. Any number of transistors, like twenty or thirty or more, may be connected in parallel.

Figure 2:
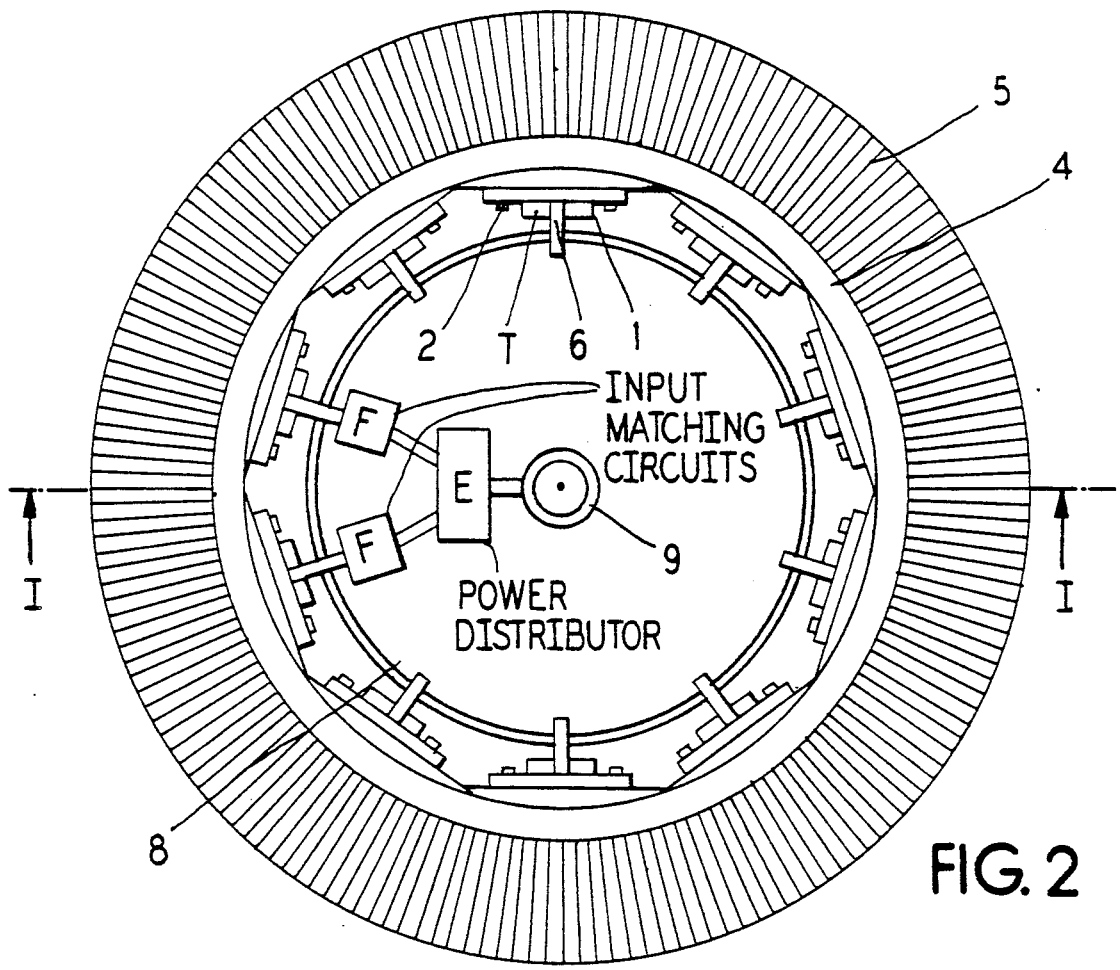
FIG. 2 is a top plan view of the power amplifier shown in FIG. 1.

FIGS. 2 and 3 show a specific embodiment of a power amplifier according to the invention for ultrashort waves, comprising ten transistors arranged in a ring. While FIG. 2 shows the assembly from above with the top cover removed, FIG. 3 presents a corresponding section along line I—I in FIG. 2. The individual transistors T are connected at their flanges 1 to the inner wall of a cooling ring 4, for instance by screws 2. The cooling ring 4 is formed with cooling fins 5 projecting in an outward direction. The input and output connections G and D of each transistor are embodied by spring contact strips 6 and 7 projecting axially upwardly and downwardly, respectively, and being radially bent inwardly to lie in a plane. The flanges 1 of the transistors are directly connected galvanically to the cooling ring 4. The connection established between the plate or flange 1 and the inside wall of the cooling ring 4 is a good thermal conductor so that the heat due to energy losses of the individual transistors T is dissipated readily by the cooling ring 4. The semiconductor plates of the individual transistors also may be formed in ring shape directly on the inner or outer walls of the cooling ring. That provides even better heat transfer and makes the overall structure simpler still.

The individual input matching circuits F and their associated correction units P and power distributor E may be formed as printed circuits on a corresponding printed circuit board 8. The input terminal tabs 6 of the transistors are connected directly to the corresponding terminal points on the printed circuit board 8. The input 9 into power distributor E is provided by a connecting socket which projects to the outside through the closure cap 11, which is removed in FIG. 2.

The output terminal tabs 7 (drain connections D) of the transistors T are galvanically interconnected by a metal disc 13 mounted from below and having its edge contacting the terminal tabs 7. The middle of the metal disc 13 provides the common output connection K of the directly combined output connections D of the transistors. The size and thickness of the disc 13 are so selected that the connection between the terminal tabs 7 and the common output connection K is made as best as possible without inductance or transformation regarding the respective operating frequency range concerned. An inner conductor section 14 is placed in the middle (K) of the metal disc 13 and is connected electrically to the metal disc 13. Together with the cooling ring 4 acting as an outer conductor, this inner conductor section 14 forms a coaxial transmission line system. A first inner conductor section 15 which extends between the contact metal disc 13 and an intermediate disc 16 connected electrically to the inner conductor section 14 by a contact spring ring 17 provides the first inductor 15 of the output matching circuit A. The intermediate disc 16 is formed with a symmetric arrangement of capacitors 18 all around the inner conductor section 14. These capacitors 18 have their respective other ends connected electrically to the inside wall of the cooling ring 4 adjacent the edge of the intermediate disc 16. The next inner conductor section 19 forms the second inductor 19 of the matching circuit A. A disc 21 of insulating material is placed between the face end of the inner conductor section 14 and the inner conductor of an output socket 20 so as to form a coupling capacitor 21. Supply voltage is fed to the transistors through a choke 23 connected to the inner conductor section 19, with a closure cap 22 assuring proper insulation.

Although we have described our invention by reference to particular illustrative embodiments thereof, many changes and modifications of the invention may become apparent to those skilled in the art without departing from the spirit and scope thereof. We therefore intend to include within the patent warranted hereon, all such changes and modifications as may reasonably and properly be included within the scope of our contribution to the art.

We claim as our invention:

1. A high frequency transistor power amplifier, comprising:
    a plurality of power transistors each having an input terminal and an output terminal, the transistors being disposed in an annular arrangement;
    the input terminals being connected to a common input through separate input matching circuits and a distributor circuit;
    the output terminals being combined directly in a common output connection without any intermediate matching circuits; and
    said common output connection being connected to a single output matching circuit common to all the power transistors.

2. A power amplifier according to claim 1 wherein the power transistors are disposed in a ring arrangement such that their output terminals lie in a ring in a plane and are electrically interconnected by a planar contact disc, the single common output matching circuit being connected at the center of this contact disc.

3. A power amplifier according to claim 1 wherein the common output matching circuit comprises a coaxial line system.

4. A power amplifier according to claim 1 wherein the common output matching circuit comprises a cavity resonator.

5. A power amplifier according to claim 1 wherein the common output matching circuit comprises a waveguide arrangement.

6. A power amplifier according to claim 2 wherein an inner conductor section is electrically fixed at the center of the contact disc so as to extend concentrically with the ring arrangement of power transistors, and the common output matching circuit comprising a coaxial transmission line formed within the ring arrangement of the transistors.

7. A power amplifier according to claim 1 wherein the power transistors in the annular arrangement each have a flange fixed to an inner surface of a cooling ring.

8. A high frequency transistor power amplifier, comprising:
    a plurality of FET power transistors each having a source terminal, an input gate terminal, and an output drain terminal, the transistors being mounted by thin source terminals to an inner wall of a circular cooling ring;
    the input gate terminals being connected to a common input through means for matching and distribution;
    the output drain terminals being combined directly at a common output connection in the form of a disc which connects at its periphery to the output drain terminals, and wherein a center of the disc has an inner conductor attached as a common output connection; and
    said common output connection inner conductor connects to a single output matching circuit common to all the power transistors.

9. A high frequency transistor power amplifier, comprising:
    a plurality of power transistors each having an input terminal and an output terminal, the transistors being disposed in an annular arrangement;
    the input terminals being connected to a common input through means for input matching;
    the output terminals being connected by a common plate to a common output connection; and
    said common output connection being connected to a single output matching circuit common to all the power transistors.

* * * * *

UNITED STATES PATENT AND TRADEMARK OFFICE
CERTIFICATE OF CORRECTION

PATENT NO. : 5,121,083
DATED : June 9, 1992
INVENTOR(S) : Helmut Bauer and Uwe Dalisda It is certified that error appears in the above-identified patent and that said Letters Patent is hereby corrected as shown below:

On the title page, item (73): Assignee:", please cancel "Siemens Aktiengesellschaft", and substitute --Rohde & Schwarz GmbH & Co. KG.--

Signed and Sealed this

First Day of February, 1994

Attest:

BRUCE LEHMAN

*Attesting Officer*       Commissioner of Patents and Trademarks